(12) United States Patent
Chen et al.

(10) Patent No.: US 10,722,026 B2
(45) Date of Patent: Jul. 28, 2020

(54) SLIDE RAIL ASSEMBLY AND BRACKET DEVICE THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/923,035

(22) Filed: Mar. 16, 2018

(65) Prior Publication Data

US 2019/0082828 A1  Mar. 21, 2019

(30) Foreign Application Priority Data

Sep. 15, 2017  (TW) .............................. 106132002 A

(51) Int. Cl.
| | |
|---|---|
| *A47B 57/54* | (2006.01) |
| *H05K 7/14* | (2006.01) |
| *A47B 88/43* | (2017.01) |
| *A47B 88/483* | (2017.01) |
| *A47B 57/48* | (2006.01) |

(52) U.S. Cl.
CPC .......... *A47B 57/545* (2013.01); *A47B 57/485* (2013.01); *A47B 88/43* (2017.01); *A47B 88/483* (2017.01); *H05K 7/1489* (2013.01)

(58) Field of Classification Search
CPC ..... A47B 57/545; A47B 57/485; A47B 88/43; A47B 88/483
See application file for complete search history.

(56) References Cited

U.S. PATENT DOCUMENTS

| 8,371,454 | B2 * | 2/2013 | Chen ..................... H05K 7/1421 211/26 |
|---|---|---|---|
| 8,770,528 | B2 * | 7/2014 | Chen ..................... H05K 7/1421 211/26 |
| 9,370,120 | B2 | 6/2016 | Chen et al. |
| 9,867,308 | B2 | 1/2018 | Chen et al. |

(Continued)

FOREIGN PATENT DOCUMENTS

| EP | 2949238 A1 | 12/2015 |
|---|---|---|
| JP | 2017059503 A | 3/2017 |

*Primary Examiner* — Anita M King
(74) *Attorney, Agent, or Firm* — Alan D. Kamrath; Karin L. Williams; Mayer & Williams PC

(57) ABSTRACT

A bracket device of a slide rail assembly includes a bracket and a fastening member. The bracket includes a side wall and a mounting member adjacent to the side wall. The fastening member is movable relative to the bracket, and includes a side part, a fastening part and a blocking feature. The fastening part is bent relative to the side part, and the blocking feature is arranged at the side part. When the fastening member is located at a predetermined position relative to the bracket, the blocking feature is adjacent to the mounting member. When the fastening member is moved away from the predetermined position, the blocking feature is away from the mounting member.

6 Claims, 6 Drawing Sheets

(56) References Cited

U.S. PATENT DOCUMENTS

| | | | |
|---|---|---|---|
| 9,986,828 B2* | 6/2018 | Chen | A47B 88/407 |
| 10,021,977 B2 | 7/2018 | Chen et al. | |
| 10,149,538 B2* | 12/2018 | Chen | H05K 7/1489 |
| 10,292,297 B2 | 5/2019 | Chen et al. | |
| 2005/0156493 A1* | 7/2005 | Yang | H05K 7/1489 |
| | | | 312/334.5 |
| 2010/0072153 A1* | 3/2010 | Chen | H05K 7/1421 |
| | | | 211/183 |
| 2013/0075350 A1* | 3/2013 | Raney | A47B 88/43 |
| | | | 211/13.1 |
| 2017/0013959 A1 | 1/2017 | Chen et al. | |
| 2017/0055707 A1* | 3/2017 | Chen | A47B 88/407 |

* cited by examiner

SLIDE RAIL ASSEMBLY AND BRACKET DEVICE THEREOF

BACKGROUND OF THE INVENTION

1. Field of the Invention

The present invention relates to a bracket device for a slide rail, and more particularly to a bracket device of a slide rail assembly applicable to a rack.

2. Description of the Prior Art

As shown in FIG. 1, in a rack system, a slide rail assembly 100 can usually be mounted to a post 104 of a rack through a bracket device 102. Wherein, the bracket device 102 comprises at least one mounting member 106 configured to be inserted into a hole 108 of the post 104, and a fastening member 110 configured to lock the post 104. Wherein, the fastening member 110 is rotatable through a shaft member 112, and the fastening member 110 has a side part 110a, a fastening part 110b and an extension part 110c. Wherein the fastening part 110b is substantially perpendicularly bent relative to the side part 110a, and the extension part 110c is substantially perpendicularly bent relative to the fastening part 110b to extend toward the post 104.

As shown in FIG. 2, when the slide rail assembly 100 is mounted to the post 104, the slide rail assembly 100 may sway to slightly move due to an unintentional force or an external force being applied to the slide rail assembly 100 and/or the bracket device 102. In addition, the fastening member 110 of the bracket device 102 may be deflected along a first direction R1 by the force. In such case, the at least one mounting member 106 may be detached from the hole 108 of the post 104 along a direction D. Or, as shown in FIG. 3, the fastening member 110 of the bracket device 102 may be deflected along another direction (such as a second direction R2 shown in FIG. 3) by the force. In such case, the extension part 110c of the fastening member 110 may hit the post 104, such that fastening member 110 may be deformed or damaged.

Therefore, it is important to develop a reliable bracket product for a slide rail.

SUMMARY OF THE INVENTION

The present invention provides a slide rail assembly capable of being mounted to a post through a bracket device.

According to an embodiment of the present invention, a slide rail assembly is applicable to a post. The slide rail assembly comprises a first rail, a second rail and a bracket device. The second rail is movable relative to the first rail. The bracket device is attached to the first rail. The bracket device comprises a bracket and a fastening member. The bracket comprises a side wall and a mounting member adjacent to the side wall. The mounting member is configured to be inserted into a hole of the post. The fastening member comprises a side part, a fastening part and a blocking feature. The side part pivoted to the bracket. The fastening part is bent relative to the side part. The blocking feature is arranged on the side part. Wherein, when the mounting member is inserted to the hole of the post in order to mount the slide rail assembly to the post, the fastening part of the fastening member is configured to lock the post. Wherein, when the slide rail assembly is moved by a force, the blocking feature is configured to abut against the post in order to prevent the mounting member from being detached from the hole of the post.

Preferably, the bracket further comprises an end wall bent relative to the side wall. The mounting member is arranged on the end wall.

Preferably, the mounting member comprises a first part and a second part. The first part and the second part have different dimensions.

Preferably, the fastening part is substantially perpendicularly bent relative to the side part.

Preferably, the blocking feature is a protrusion.

Preferably, the blocking feature is integrally formed with the side part of the fastening member.

Preferably, the blocking feature is not integrally formed with the side part of the fastening member.

Preferably, the slide rail assembly further comprises a third rail movably mounted between the first rail and the second rail.

According to another embodiment of the present invention, a bracket device comprises a bracket and a fastening member. The bracket comprises a side wall and a mounting member adjacent to the side wall. The fastening member comprises a side part, a fastening part and a blocking feature. The fastening part is bent relative to the side part. The blocking feature is arranged on the side part. Wherein, when the fastening member is located at a predetermined position relative to the bracket, the blocking feature is adjacent to the mounting member. Wherein, when the fastening member is rotated and moved away from the predetermined position, the blocking feature is away from the mounting member.

According to another embodiment of the present invention, a bracket device comprises a bracket and a fastening member. The bracket comprises a side wall and a mounting member adjacent to the side wall. The fastening member is movable relative to the bracket and comprises a side part, a fastening part and a blocking feature. The fastening part is bent relative to the side part. Wherein, the blocking feature is arranged on the side part, and the blocking feature is adjacent to a bending position between the side part and the fastening part.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
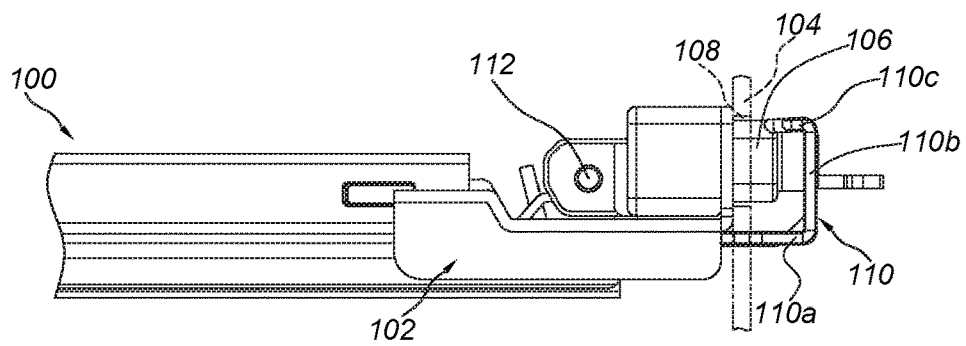
FIG. 1 is a diagram showing a slide rail assembly of the prior art being mounted to a post through a bracket device with a fastening member locking the post.
Figure 2:
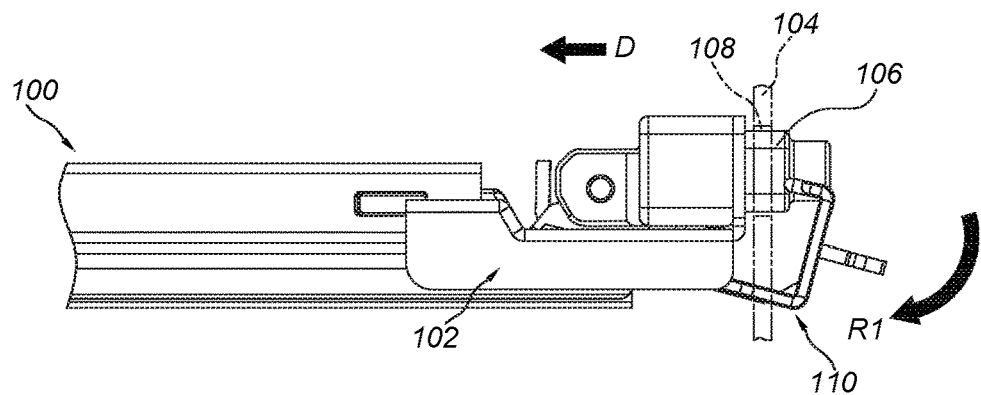
FIG. 2 is a diagram showing the slide rail assembly of the prior art being mounted to the post with the fastening member being deflected by an external force along one direction.
Figure 3:
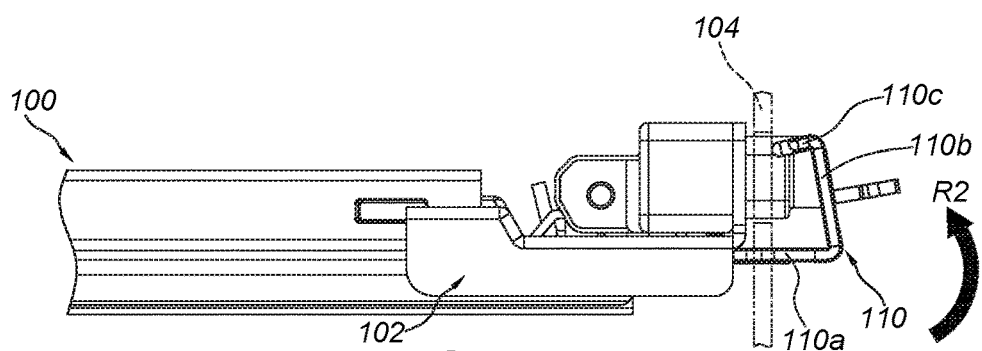
FIG. 3 is a diagram showing the slide rail assembly of the prior art being mounted to the post with the fastening member being deflected by the external force along another direction.
Figure 4:
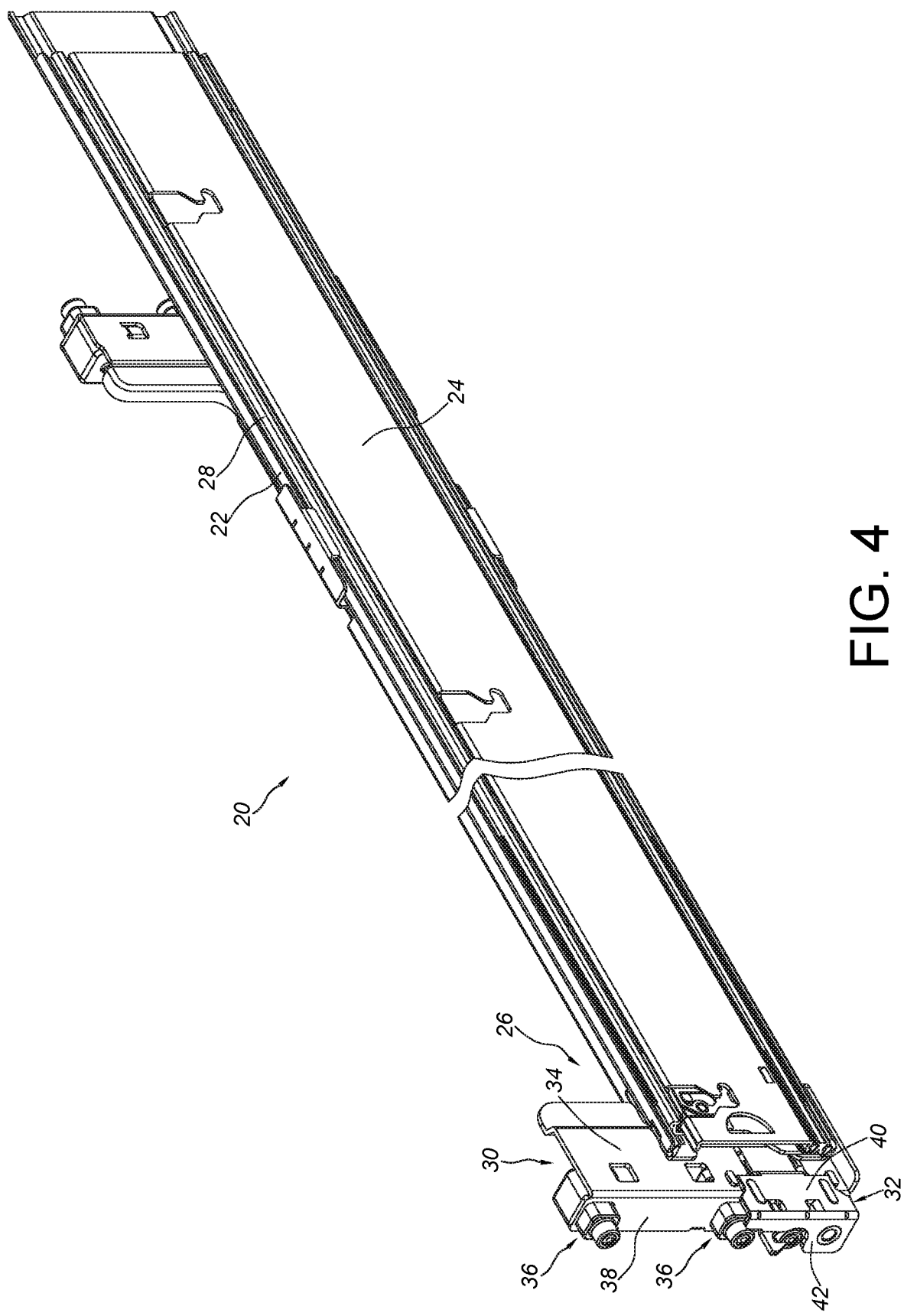
FIG. 4 is a diagram showing a slide rail assembly according to an embodiment of the present invention.

As shown in FIG. 4, a slide rail assembly 20 comprises a first rail 22, a second rail 24 and a bracket device 26.

The second rail 24 is movable relative to the first rail 22. Preferably, the slide rail assembly 20 further comprises a third rail 28 movably mounted between the first rail 22 and the second rail 24. The third rail 28 is configured to extend a traveling distance of the second rail 24 relative to the first rail 22. Such configuration is well known to those skilled in the art. For simplification, no further illustration is provided.

The bracket device 26 is attached to the first rail 22, and the bracket device 26 comprises a bracket 30 and a fastening member 32.

The bracket 30 comprises a side wall 34 and at least one mounting member 36 adjacent to the side wall 34. The side wall 34 is connected to the first rail 22. Preferably, the bracket 30 further comprises an end wall 38, and the end wall 38 is substantially perpendicularly bent relative to the side wall 34. Wherein, the at least one mounting member 36 (or a plurality of mounting members) is arranged on the end wall 38.

Figure 5:
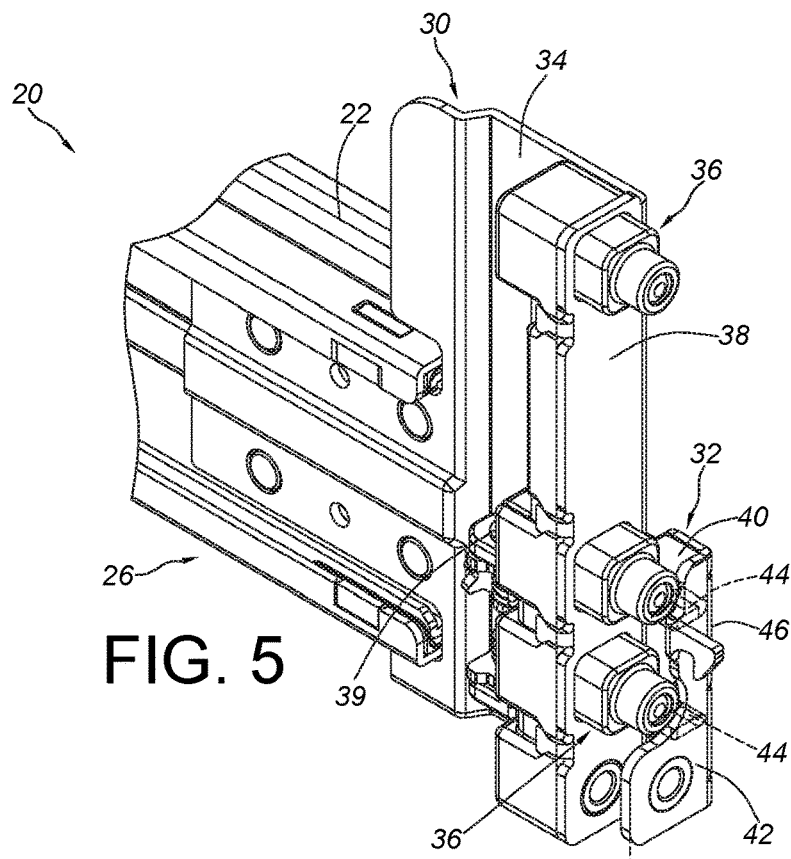
FIG. 5 is a diagram showing a bracket device with a fastening member being located at a locking position according to an embodiment of the present invention.

As shown in FIG. 4 and FIG. 5, the fastening member 32 is movable relative to the bracket 30. Preferably, the fastening member 32 is pivoted relative to the bracket 30 through a shaft member 39. The fastening member 32 comprises a side part 40 and a fastening part 42 bent relative to the side part 40. Preferably, the side part 40 is pivoted to the bracket 30, and the fastening part 42 is substantially perpendicularly bent relative to the side part 40, but the present invention is not limited thereto.

Figure 6:
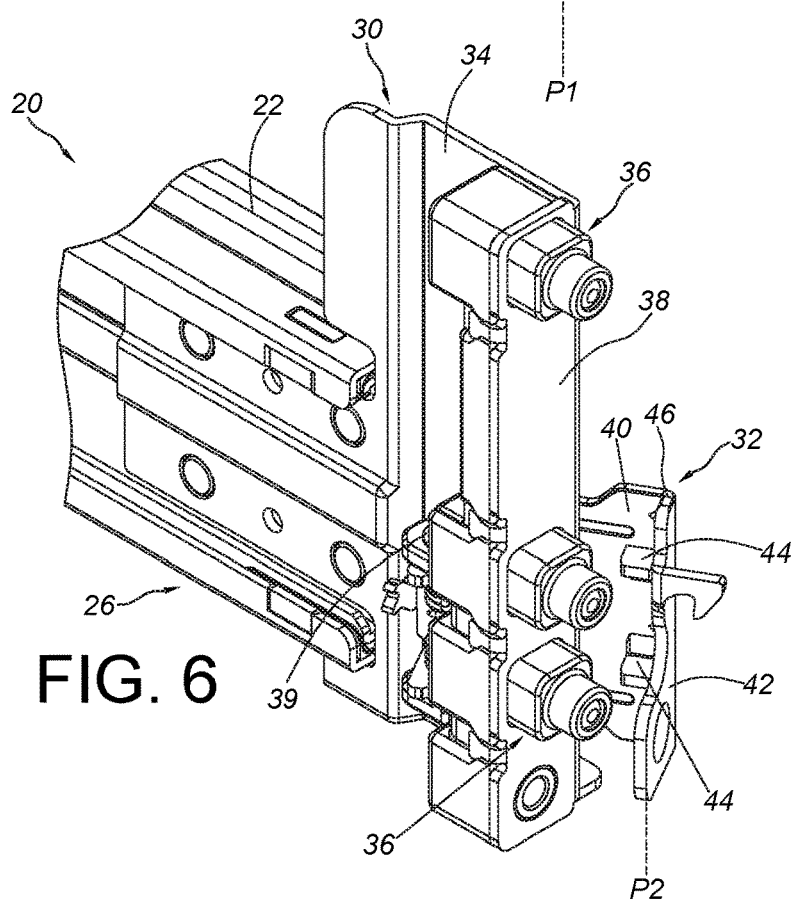
FIG. 6 is a diagram showing the bracket device with the fastening member being located at an unlocking position according to an embodiment of the present invention.

As shown in FIG. 5 and FIG. 6, the fastening member 32 further comprises a blocking feature 44 arranged on the side part 40. In the present embodiment, the blocking feature 44 is arranged on the side part 40 and adjacent to a bending position 46 between the side part 40 and the fastening part 42.

When the fastening member 32 is located at a predetermined position (such as a locking position P1) relative to the bracket 30, the blocking feature 44 is adjacent to the mounting member 36 (as shown in FIG. 5). Wherein, when the fastening member 32 is rotated to move away from the locking position P1 (such as the fastening member 32 being rotated to an unlocking position P2), the blocking feature 44 is away from the mounting member 36 (as shown in FIG. 6).

Preferably, the blocking feature 44 is integrally formed with the side part 40 of the fastening member 32. Or, in an alternative embodiment, the blocking feature 44 is not integrally formed with the side part 40 of the fastening member 32. For example, an additional component comprising the blocking feature 44 can be attached to the side part 40 of the fastening member 32. Preferably, the blocking feature 44 is a protrusion.

Figure 7:
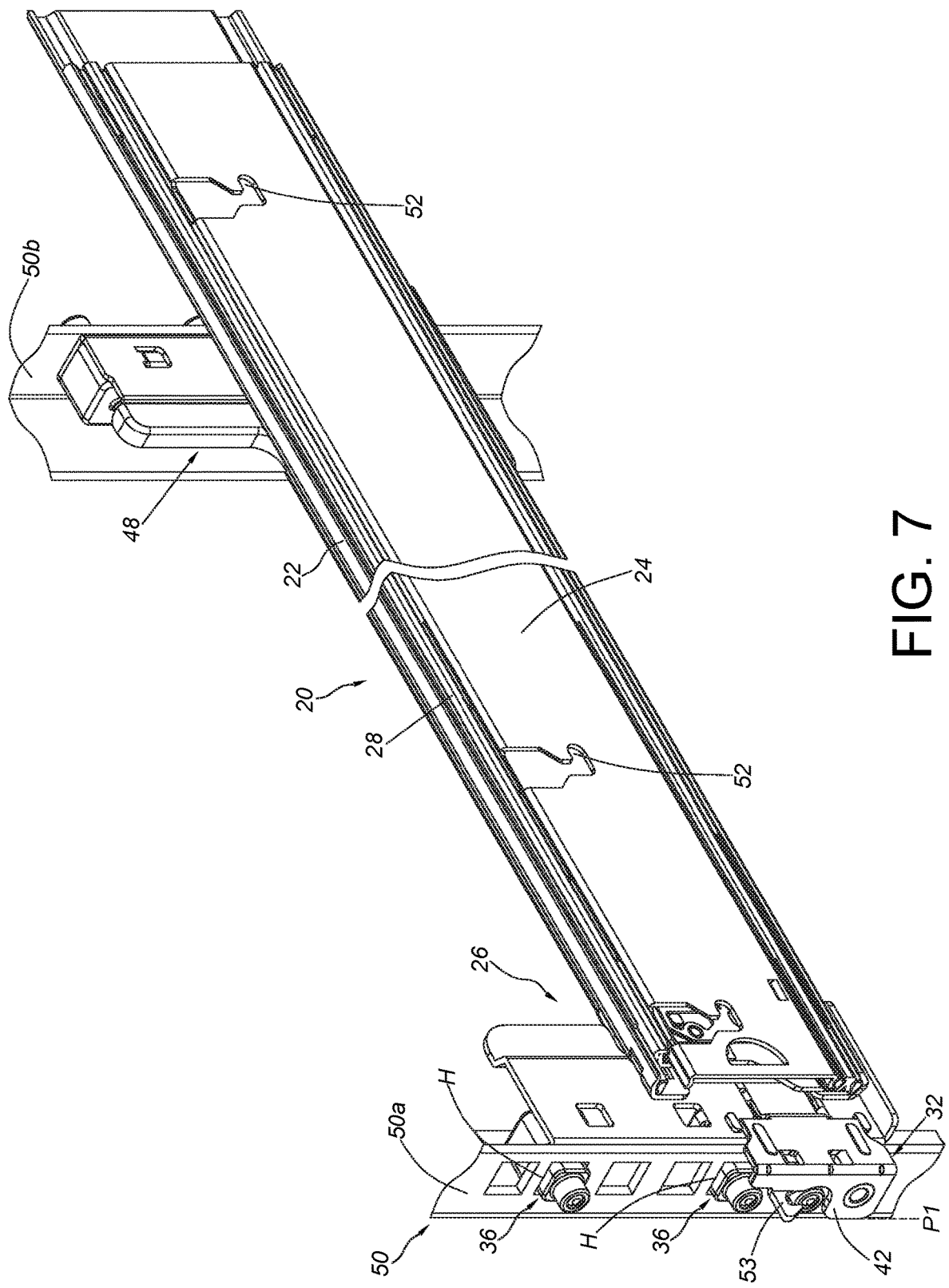
FIG. 7 is a diagram showing the slide rail assembly being mounted to a rack according to an embodiment of the present invention.

As shown in FIG. 7, the first rail 22 of the slide rail assembly 20 can be mounted to two posts 50a, 50b of a rack 50 through the bracket device 26 and another bracket device 48. Wherein, the mounting member 36 of the bracket device 26 is configured to be inserted into a hole H of the post 50a. When the fastening member 32 is located at the locking position P1, the fastening part 42 of the fastening member 32 is configured to lock the post 50a in order to prevent the slide rail assembly 20 from being freely detached from the post 50a.

In addition, the second rail 24 and the third rail 28 can be in a retracted state relative to the first rail 22. Furthermore, the second rail 24 has a plurality of mounting features 52 for mounting a carried object. Preferably, the fastening member 32 further comprises a hook 53 connected to the fastening part 42. When the second rail 24 is in the retracted state relative to the first rail 22, the hook 53 is configured to be engaged with an engaging member of the carried object, such that the second rail 24 can be held in the retracted state relative to the first rail 22.

Figure 8:
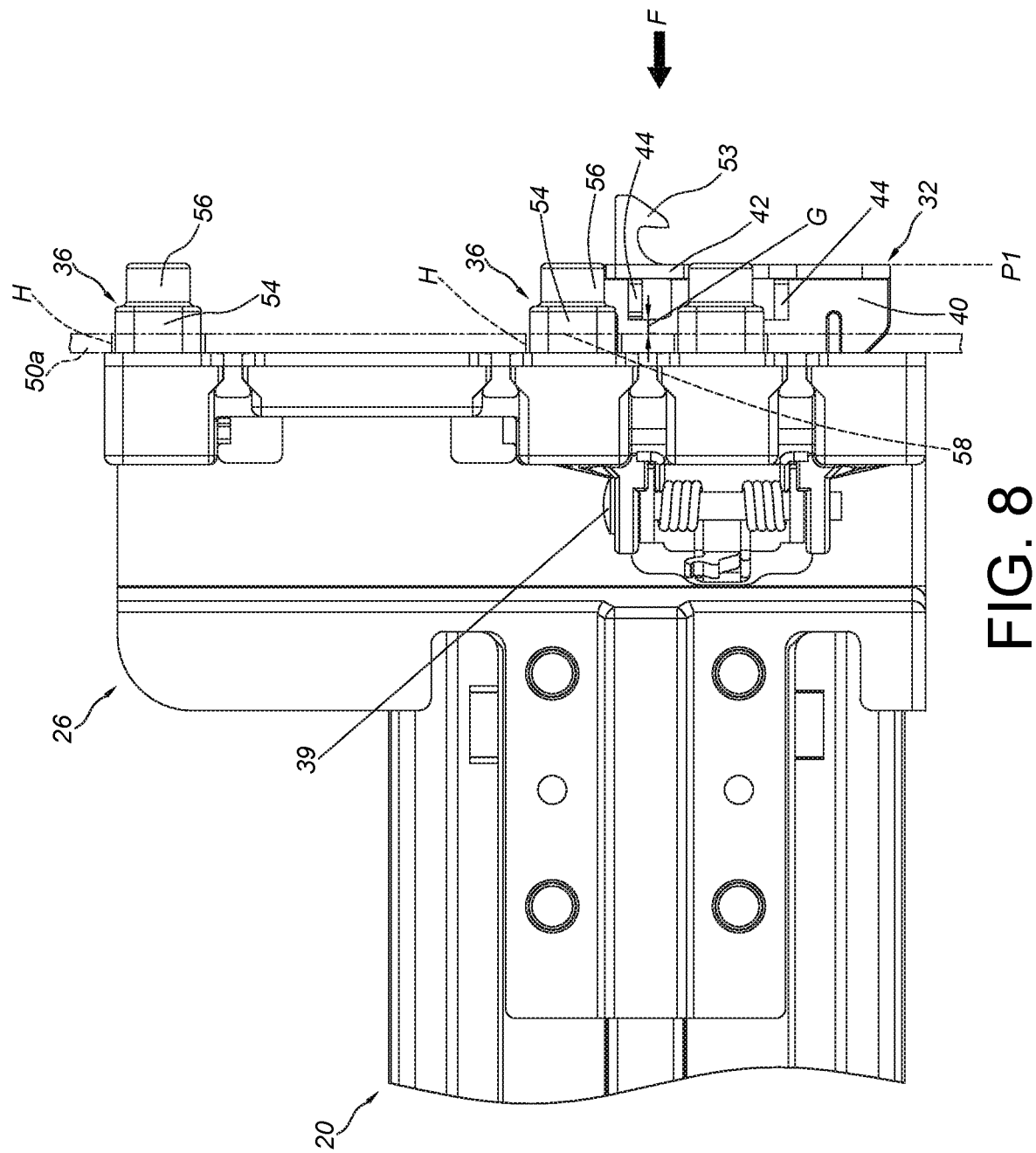
FIG. 8 is a diagram showing the slide rail assembly being mounted to a post of the rack through the bracket device according to an embodiment of the present invention.

As shown in FIG. 8, the mounting member 36 of the bracket device 26 is inserted into the hole H of the post 50a, in order to mount the slide rail assembly 20 to the post 50a. When the fastening member 32 is located at the locking position P1, the fastening part 42 of the fastening member 32 is configured to lock the post 50a. Preferably, the mounting member 36 comprises a first part 54 and a second part 56, and the first part 54 and the second part 56 have different dimensions. For example, an outer diameter of the first part 54 is greater than an outer diameter of the second part 56. According to such arrangement, the first part 54 and the second part 56 can be inserted to holes of various posts with different diameters. In the present embodiment, the first part 54 of the mounting member 36 is inserted into the hole H of the post 50a. Moreover, when the slide rail assembly 20 is mounted to the post 50a, a gap G is defined between the blocking feature 44 and a wall surface 58 of the post 50a. The gap G is smaller than a distance between the fastening part 42 and the wall surface 58 of the post 50a.

Figure 9:
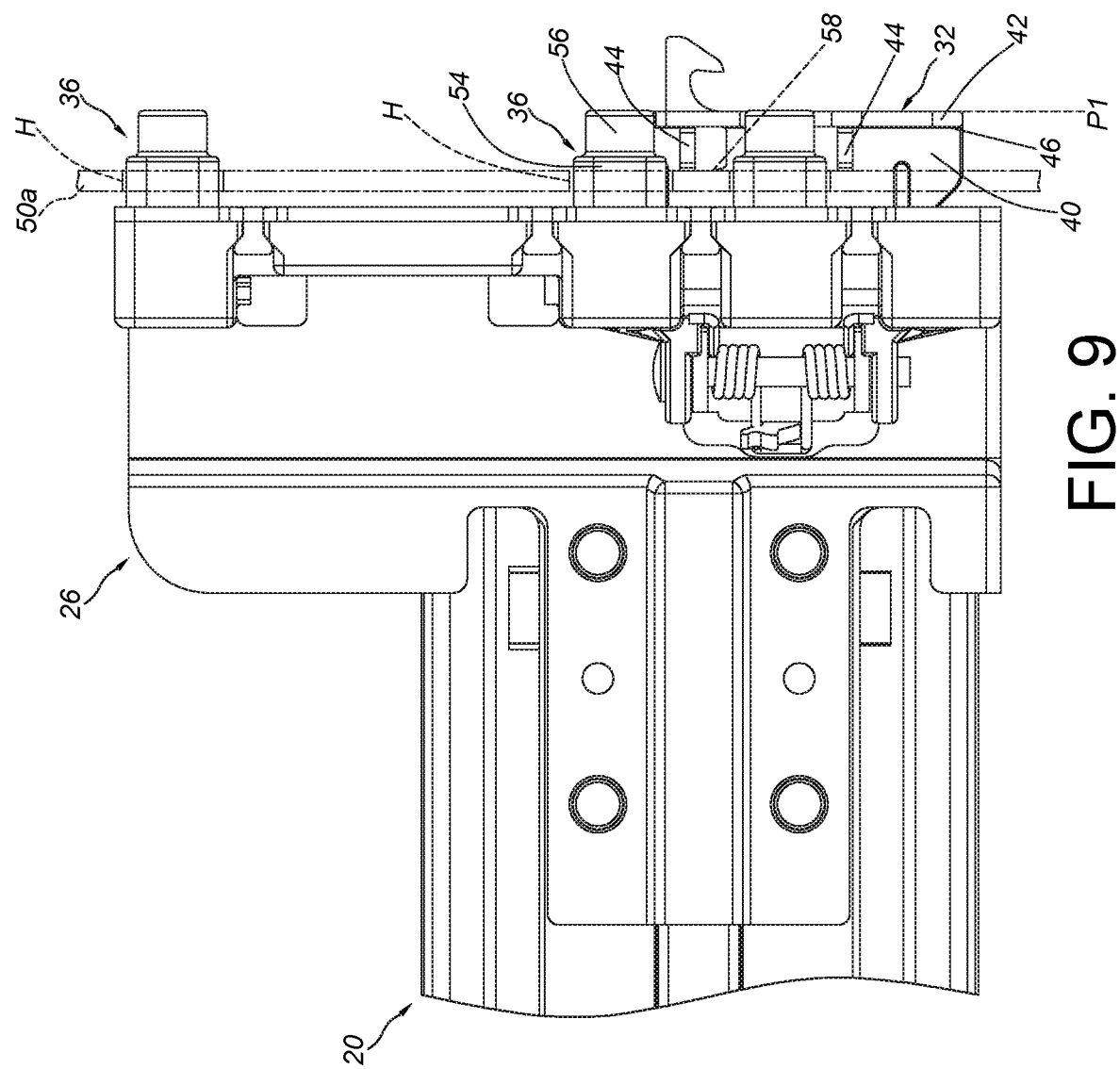
FIG. 9 is a diagram showing the slide rail assembly being mounted to the post of the rack through the bracket device with a blocking feature of the bracket device abutting against the post according to an embodiment of the present invention.

As shown in FIG. 8 and FIG. 9, when the slide rail assembly 20 receives a force F along a predetermined direction, the blocking feature 44 is configured to abut against the wall surface 58 of the post 50a in order to prevent the mounting member 36 from being detached from the hole H of the post 50a.

For example, when the slide rail assembly 20 receives the unintentional force F along the predetermined direction, the entire slide rail assembly 20 may be moved a distance which is equivalent to the gap G along the predetermined direction. Wherein, through the blocking feature 44 of the fastening member 32 abutting against the wall surface 58 of the post 50a, the entire slide rail assembly 20 is not further moved along the predetermined direction, such that the first part 54 (or the second part 56) of the mounting member 36 can be prevented from being detached from the hole H of the post 50a, and the fastening member 32 can be prevented from freely swaying at the locking position P1. In addition, since the blocking feature 44 is arranged on the side part 40 and adjacent to the bending position 46 between the side part 40 and the fastening part 42, deformation of the fastening part 42 and the side part 40 can be prevented when the blocking feature 44 abuts against the post 50a due to the force F. Moreover, the blocking feature 44 (such as the protrusion)

can also improve structural strength of the fastening member 32 (the side part 40 of the fastening member 32).

Therefore, the slide rail assembly and/or the bracket device of the present invention are characterized in that:

1. The blocking feature 44 is arranged on the side part 40 of the fastening member 32 for improving the structural strength of the fastening member 32 and preventing the fastening member 32 from being deformed by the force.

2. When the slide rail assembly 20 is mounted to the post 50a through the bracket device 26 and receives an unintentional force, the blocking feature 44 of the fastening member 32 is configured to abut against the post 50a in order to prevent the mounting member 36 from being detached from the hole H of the post 50a, and prevent the fastening member 32 from freely swaying at the locking position P1.

3. The blocking feature 44 is arranged on the side part 40 and adjacent to the bending position 46 between the side part 40 and the fastening part 42. When the blocking feature 44 abuts against the post 50a due to the force F, deformation of the fastening part 42 and the side part 40 can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, applicable to a post, the slide rail assembly comprising:
    a first rail;
    a second rail movable relative to the first rail; and
    a bracket device attached to the first rail, the bracket device comprising:
        a bracket comprising a side wall and a mounting member adjacent to the side wall, the mounting member configured to be inserted into a hole of the post; and
        a fastening member comprising a side part pivoted to the bracket, a fastening part bent relative to the side part, and a blocking feature arranged on the side part;
    wherein when the mounting member is inserted to the hole of the post in order to mount the slide rail assembly to the post, the fastening part of the fastening member is configured to lock the post;
    wherein when the slide rail assembly is moved by a force, the blocking feature is configured to abut against the post in order to prevent the mounting member from being detached from the hole of the post;
    wherein the bracket further comprises an end wall bent relative to the side wall, and the mounting member is arranged on the end wall; and
    wherein the blocking feature is adjacent to a bending position between the side part and the fastening part, and the blocking feature is a protrusion configured to be located between the fastening part and the end wall.

2. The slide rail assembly of claim 1, wherein the mounting member comprises a first part and a second part, and the first part and the second part have different dimensions.

3. The slide rail assembly of claim 1, wherein the fastening part is substantially perpendicularly bent relative to the side part.

4. The slide rail assembly of claim 1, wherein the blocking feature is integrally formed with the side part of the fastening member.

5. The slide rail assembly of claim 1, wherein the blocking feature is not integrally formed with the side part of the fastening member.

6. The slide rail assembly of claim 1, further comprising a third rail movably mounted between the first rail and the second rail.

* * * * *